United States Patent
Aoki et al.

(10) Patent No.: US 7,368,064 B2
(45) Date of Patent: May 6, 2008

(54) CLEANING SOLUTION AND MANUFACTURING METHOD FOR SEMICONDUCTOR DEVICE

(75) Inventors: Hidemitsu Aoki, Kanagawa (JP); Tatsuya Suzuki, Kanagawa (JP); Takuo Ohwada, Tokyo (JP); Kaoru Ikegami, Soka (JP); Norio Ishikawa, Soka (JP)

(73) Assignees: NEC Electronics Corporation, Kanagawa (JP); Kanto Kagaku Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/115,275

(22) Filed: Apr. 27, 2005

(65) Prior Publication Data

US 2005/0236362 A1  Oct. 27, 2005

(30) Foreign Application Priority Data

Apr. 27, 2004  (JP) .............................. 2004-131419

(51) Int. Cl.
 *B44C 1/22* (2006.01)
(52) U.S. Cl. ............................ 216/57; 216/58; 216/41; 438/706; 252/79.1; 252/79.3; 252/79.4
(58) Field of Classification Search .................. 216/57
 See application file for complete search history.

(56) References Cited

U.S. PATENT DOCUMENTS 6,773,873 B2 * 8/2004 Seijo et al. ................. 430/329

FOREIGN PATENT DOCUMENTS

| JP | 2003-167360 | 6/2003 |
|---|---|---|
| JP | 2003-280219 | 10/2003 |
| JP | 2003-313594 | 11/2003 |
| WO | WO 00/44867 | 8/2000 |
| WO | WO 03/006598 | 1/2003 |

OTHER PUBLICATIONS

NIST; https://srmors.nist.gov/view_detail.cfm?srm=1065B; printed Oct. 5, 2005.*
Sigma-aldrich;http://www.sigmaaldrich.com/catalog/search/ProductDetail/ALDRICH/377228.*

* cited by examiner

*Primary Examiner*—Nadine G. Norton
*Assistant Examiner*—Patricia A. George
(74) *Attorney, Agent, or Firm*—Young & Thompson

(57) ABSTRACT

A method of manufacturing a semiconductor device forms an interlayer insulating film on a nickel silicide layer formed on a substrate, and forms a through hole by performing dry etching using a resist pattern, formed on the interlayer insulating film, as a mask and then removing the resist pattern by ashing. A wafer after an ashing process is cleaned using a cleaning solution comprised of aqueous solution having a content of the fluorine-containing compound of 1.0 to 5.0 mass %, a content of chelating agent of 0.2 to 5.0 mass %, and a content of the organic acid salt of 0.1 to 3.0 mass %.

7 Claims, 3 Drawing Sheets

CLEANING SOLUTION AND MANUFACTURING METHOD FOR SEMICONDUCTOR DEVICE

BACKGROUND OF THE INVENTION

1. Field of the Invention

The present invention relates to cleaning solution for removing a residue after an ashing process in a manufacturing process for a semiconductor device, and a manufacturing method for a semiconductor device using the cleaning solution, and, more particularly, to cleaning solution to be used in manufacturing a semiconductor device provided with a nickel silicide layer, and a manufacturing method for the semiconductor device.

2. Description of the Related Art

With the recent miniaturization and enhancement of the performance of system LSIs (Large Scale Integrated circuits), there is a demand for lowering the resistances of a diffusion layer (a source region and a drain region) for forming a transistor. Studies have been made on a scheme of forming a silicide layer to be formed on the diffusion layer using a nickel silicide having a lower resistance than a cobalt silicide, which has been used conventionally in order to decrease the contact resistance of the source region and the drain region When holes and wiring grooves or the like are formed in the manufacturing process for a semiconductor device, in general, a resist pattern is formed using the lithography technology, dry etching is performed using the resist pattern as a mask, then an ashing process to ash the resist pattern with a plasma or the like is executed, and residues sticking on the wafer surface and inside of holes are removed with cleaning solution. As the residues remaining after the ashing process, ashing residues, such as incompletely ashed product and oxide of the resist produced by the ashing process adheres on the wafer surface, and etching deposition produced at the time of dry etching adheres inside the holes.

Conventional cleaning solutions to remove those residues include RCA cleaning solution or the like which is comprised of acidic cleaning solution, such as sulfuric acid/hydrogen peroxide/water mixture (SPM), and alkaline cleaning solution, such as ammonium hydroxide/hydrogen peroxide/water mixture (APM). Other cleaning solutions include solution containing an amine compound, such as hydroxyl amine, a solution containing fluorine-containing compound, such as ammonium fluoride, a solution containing both amine compound and fluorine-containing compound, solution containing organic acid, and a solution containing both organic acid and fluorine-containing compound.

There are cleaning solutions proposed for a substrate on which a Cu wiring and a low-dielectric interlayer insulating film are formed (see, for example, Japanese Patent Application (JPA) No. 2003-167360, JPA No. 2003-280219, and JPA No. 2003-313594). The photoresist residue removing solution described in JPA No. 2003-167360 suppresses corrosion of the wiring material and degrading of the interlayer insulating film by using a composition containing one or more compounds selected from a group of aliphatic polycarboxylic acids and aliphatic polycarboxylate, and one or more compounds selected from a group of reducing compounds and salts thereof. The photoresist residue removing solution described in JPA No. 2003-280219 prevents corrosion of the wiring material and damages on a barrier metal layer and the interlayer insulating film by using a composition containing one or more fluorine-containing compounds and one or more compounds selected from a group of glyoxylic acid, ascorbic acid, glucose, fructose, lactose and mannose. Further, the cleaning solution described in JPA No. 2003-313594 contains fluoride ions having a concentration of 0.001 to 1 mass % and pH of 2 to 7, thereby preventing dissolution and deterioration of a low-resistance metal film and a low-dielectric interlayer insulating film.

The prior arts however have the following problems. While cobalt silicide is not dissolved in the RCA cleaning solution, nickel silicide is dissolved in the RCA cleaning solution. When a substrate on which nickel silicide layer is formed is cleaned with the RCA cleaning solution which has conventionally been used in cleaning a substrate on which cobalt silicide layer is formed, the deposit can be removed with a problem that the nickel silicide layer is dissolved. It is not desirable that the nickel silicide layer dissolves and becomes thinner, for the contact resistance increases. Dissolution of the nickel silicide layer by cleaning is more noticeable on the nickel silicide layer which is not doped with an impurity than on the nickel silicide layer doped with an impurity. Particularly, the dry-etched upper layer portion or the portion where a through hole is formed is likely to dissolve.

The cleaning solution containing amine compound and the cleaning solution containing organic acid as described in JPA No. 2003-167360 have a problem on the removability of ashing residue. The cleaning solution containing amine compound and fluorine-containing compound, the cleaning solution containing fluorine-containing compound as described in JPA No. 2003-313594, and the cleaning solution containing organic acid and fluorine-containing compound as described in JPA No. 2003-280219 have a problem such that the composition range and the concentration range capable of completely removing residues without damaging a nickel silicide layer are extremely narrow. For example, the cleaning solution containing amine compound and fluorine-containing compound, which may lead to a longer process time and is thus not fit for a cleaning method that demands fast processing, such as single wafer cleaning. The cleaning solution containing fluorine-containing compound and the cleaning solution containing organic acid and fluorine-containing compound cannot be used in processes that cause a density change, such as a process which recycles chemical solution, for the cleaning solutions suffer a narrow range for not damaging the nickel silicide layer.

While the cleaning solutions described in JPA No. 2003-167360, JPA No. 2003-280219 and JPA No. 2003-313594 are said not to damage wiring material and an interlayer insulating film, the wiring material and the interlayer insulating film, if dissolved, do not matter at all for they are 300 nm thick or thicker. As the nickel silicide layer is very thin, about 10 nm thick, and is expected to become thinner in the future, even a slight change in thickness may greatly influence the contact resistance and may cause an operational failure.

SUMMARY OF THE INVENTION

Accordingly, it is an object of the invention to provide a cleaning solution and a semiconductor device manufacturing method, which can remove residues after ashing without damaging a nickel silicide layer, and have a wide margin of usage.

A cleaning solution according to the invention comprises a fluorine-containing compound; a chelating agent; and an organic acid salt, whereby the cleaning solution is used to clean a substrate on which a nickel silicide layer is formed.

As the cleaning solution of the invention essentially consists of the fluorine-containing compound excellent in residue removability, chelating agent which prevents readhesion of residue and adjusts generation of $HF_2^-$, and the organic acid salt or the buffer component to keep the content of $HF_2^-$ constant, the residue remaining after ashing can be removed without damaging the nickel silicide layer. As an organic acid salt is added to the cleaning solution, the content of $HF_2^-$ can be kept constant even when the concentration changes. This can make the margin for usage wider than those of the conventional cleaning solutions.

It is preferable that a content of the fluorine-containing compound should be 1.0 to 5.0 mass %, a content of the chelating agent should be 0.2 to 5.0 mass %, and a content of the organic acid salt should be 0.1 to 3.0 mass %. It is particularly preferable that a content of the fluorine-containing compound should be 2.0 to 3.0 mass %, a content of the chelating agent should be 0.5 to 2.5 mass %, and a content of the organic acid salt should be 0.3 to 1.5 mass %. Accordingly, the residue remaining after ashing can be removed efficiently without damaging the nickel silicide layer.

The fluorine-containing compound is at least one fluorine-containing compound selected from a group of, for example, hydrofluoric acid, ammonium fluoride and amine fluoride. This can improve residue removability after ashing.

The chelating agent having an acid dissociation constant $pKa_n$ of 2.5 or greater at 25° C. when a dissociation stage for basic acid having a valence of n (n being an integer of 1 or greater) is n-th stage. This can make the margin for usage wider.

The organic acid salt which is carboxylic ammonium salt having an acid dissociation constant $pKa_n$ of 2.5 or greater at 25° C. when a dissociation stage for basic acid having a valence of n (n being an integer of 1 or greater) is n-th stage. This can keep the content of $HF_2^-$ constant, so that the margin for usage can be made wider.

The cleaning solution according to claim 1, wherein pH of the cleaning solution can be set to 7.0 or less. This can improve residue removability after ashing. The nickel silicide layer has a thickness of, for example, 50 nm or less. The nickel silicide layer may contain at least one metal selected from a group of Ta, Zr, Co and V, or may be doped with an impurity.

A method of manufacturing a semiconductor device according to the invention comprises the steps of forming a nickel silicide layer on a substrate; forming an interlayer insulating film on the nickel silicide layer; forming a through hole by performing dry etching using a resist pattern, formed on the interlayer insulating film, as a mask and then removing the resist pattern by ashing; and removing a residue remaining after the dry etching and the ashing by cleaning the substrate with cleaning solution containing the fluorine-containing compound, the chelating agent and the organic acid salt.

As the cleaning solution essentially consisting of the fluorine-containing compound excellent in residue removability, the chelating agent which prevents readhesion of residue and adjusts generation of $HF_2^-$, and the organic acid salt or the buffer component to keep the content of $HF_2^-$ constant, the residue remaining after ashing can be removed efficiently without damaging the nickel silicide layer.

It is preferable to use the cleaning solution in which a content of the fluorine-containing compound is 1.0 to 5.0 mass %, a content of the chelating agent is 0.2 to 5.0 mass %, and a content of the organic acid salt is 0.1 to 3.0 mass %. It is more preferable to use the cleaning solution in which a content of the fluorine-containing compound is 2.0 to 3.0 mass %, a content of the chelating agent is 0.5 to 2.5 mass %, and a content of the organic acid salt is 0.3 to 1.5 mass %. Accordingly, the residue remaining after ashing can be removed efficiently without damaging the nickel silicide layer.

The step of removing the residue may perform spin type single wafer cleaning on the substrate. This can prevent readhesion of the residue, thus improving the residue removability. Further, the cleaning solution can be recycled in the step of removing the residue. This can ensure efficient cleaning, thus improving the productivity.

As the fluorine-containing compound and the chelating agent are added to the cleaning solution according to the invention, the residue remaining after ashing can be removed without damaging the nickel silicide layer. In addition, as the organic acid salt, which has an effect of keeping the content of a dissociation species of the fluorine-containing compound constant is added to the cleaning solution, the margin for usage can be made wider.

DETAILED DESCRIPTION OF THE PREFERRED EMBODIMENT

Figure 1A:
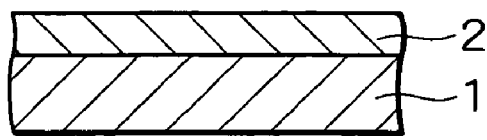
FIGS. 1A to 1D are cross-sectional views showing a method of manufacturing a semiconductor device according to a second embodiment of the invention step by step.

Preferred embodiments of the invention will be described below specifically with reference to the accompanying drawings. The present inventors conducted experiments and studies to overcome the problems, and discovered that the nickel silicide layer doped with an impurity, when exposed to plasma at the time of dry etching and ashing, turned the crystal state to amorphous and would become easily dissolvable in cleaning solution. The present inventors also found out that dissolution of the nickel silicide layer was influenced by the dissociation ions ($HF_2^-$) of the fluorine-containing compound.

To begin with, cleaning solution according to the first embodiment of the invention will be discussed. The cleaning solution according to the embodiment is a solution used in cleaning solution a substrate on which the nickel silicide layer is formed, and contains the fluorine-containing compound by 1.0 to 5.0 mass %, the chelating agent by 0.2 to 5.0 mass %, and the organic acid salt by 0.1 to 3.0 mass %. As the cleaning solution according to the embodiment essentially consists of the fluorine-containing compound excellent in residue removability and the chelating agent that has an enhanced effect of preventing readhesion of an etching deposition, the residue removability is high. As the cleaning solution of the embodiment contains the organic acid salt as the buffer component, which keeps the content of the dissociation ions of the fluorine-containing compound, it is possible to prevent dissolution of the nickel silicide layer by the fluorine-containing compound even when the cleaning solution is enriched by recycle or the like. As the concentrations of the components of the cleaning solution of the embodiment can be optimized within the ranges, the residues can be removed in a short period of time. Even if single wafer cleaning is executed while recycling the cleaning solution, therefore, the residue remaining after ashing can be removed in a short period of time without damaging the nickel silicide layer. The following will discuss the reasons for the numeral limitations made to the cleaning solution of the embodiment.

Fluorine-Containing Compound: 1.0 to 5.0 Mass %

The fluorine-containing compound has an effect of removing a residue. When the content of the fluorine-containing compound is less than 1.0 mass %, the residue removability drops. When the content of the fluorine-containing compound exceeds 5.0 mass %, the nickel silicide layer and the interlayer insulating film are dissolved or degraded while the residue removability is improved. It is therefore preferable that the content of the fluorine-containing compound should be 1.0 to 5.0 mass %, more preferably, 2.0 to 3.0 mass %. Available fluorine-containing compounds to be added to the cleaning solution of the embodiment include a hydrofluoric acid, ammonium fluoride and amine fluoride salt. Specifically, ammonium fluoride, acidic ammonium fluoride, methylamine hydrogen fluoride salt, ethylamine hydrogen fluoride salt, propylamine hydrogen fluoride salt, tetramethylammonium fluoride, tetraethylammonium fluoride, ethanolamine hydrogen fluoride salt, methylethanolamine hydrogen fluoride salt, dimethylethanol hydrogen fluoride salt, and triethylene diamine hydrogen fluoride salt can be used.

Chelating Agent: 0.2 to 5.0 Mass %

The chelating agent has an effect of preventing readhesion of an etching deposition and adjusting the dissociation ions ($HF_2^-$) of the fluorine-containing compound. When the content of the chelating agent is less than 0.2 mass %, the residue removability drops. When the content of the chelating agent exceeds 5.0 mass %, the concentration of $HF_2^-$ in the cleaning solution increases, causing dissolution or degrading of the nickel silicide layer and the interlayer insulating film. It is therefore preferable that the content of the chelating agent should be 0.2 to 5.0 mass %, more preferably, 0.5 to 2.5 mass %. Available chelating agents to be added to the cleaning solution of the embodiment include the organic acid salt or the like which has two or more ligands per molecule, and reacts with metal ions so as to become a chelating compound. Of the chelating agents, the compound containing a total of two or more carboxyl groups or hydroxyl groups, and the β-diketone compound are particularly preferable. Such chelating agents include oxalic acid and malonic acid that are aliphatic dicarboxylic acids, aliphatic hydroxy carboxylic acid, acetylacetone that is β-diketone, catechol that is dihydroxy benzene, and pyrogallol that is trihydroxy benzene. It is preferable that the chelating agent to be added to the cleaning solution of the embodiment should be aqueous and its solution should have pH of 7.0 or less. When pH of the chelating agent exceeds 7.0, the residue removability drops.

It is preferable that the chelating agent to be added to the cleaning solution of the embodiment should have the acid dissociation constant $pKa_n$ of 2.5 or greater at 25° C., when a dissociation stage for the basic acid having a valence of n (n being an integer of 1 or greater) is n-th stage. The use of a chelating agent whose acid dissociation constant $pKa_n$ has a small value increases the concentration of $HF_2^-$ in the cleaning solution even with a small amount of the additive. Table 1 below shows the acid dissociation constant $pKa_n$ of main chelating agents at 25° C.

TABLE 1

| | Dissociation stage | $pKa_n$(25° C.) |
|---|---|---|
| L-ascorbic acid | 1 | 4.03 |
| | 2 | 11.34 |
| citric acid | 1 | 2.87 |
| | 2 | 4.35 |
| | 3 | 5.69 |
| glycolic acid | 1 | 3.63 |
| oxalic acid | 1 | 1.04 |
| | 2 | 3.82 |
| d-tartaric acid | 1 | 2.82 |
| | 2 | 3.95 |
| lactic acid | 3 | 3.66 |
| malonic acid | 1 | 2.65 |
| | 2 | 5.28 |
| acetylacetone | 1 | 8.80 |
| catechol | 1 | 9.23 |
| | 2 | 13.00 |
| pyrogallol | 1 | 8.94 |
| | 2 | 11.08 |
| | 3 | 14.00 |

As shown in Table 1, the acid dissociation constant $pKa_1$ of oxalic acid at the first stage is smaller than 2.5, so that the use of oxalic acid as the chelating agent makes it easier to dissolve the nickel silicide layer than the cases where the other chelating agents shown in Table 1 are used. When a weak acid, such as citric acid, is used as the chelating agent, it becomes higher to damage the nickel silicide layer even when the cleaning solution is enriched, thereby making it possible to widen the margin for usage. It is more preferable to use the chelating agents, such as acetylacetone, catechol and pyrogallol, whose acid dissociation constants $pKa_n$ are 8.0 or greater, in the cleaning solution of the embodiment. This can significantly reduce damages on the nickel silicide layer. Because inorganic acids, such as sulfic acid, nitric acid and phosphoric acid, give damages to nickel silicide, they cannot be used. The acetic acid whose acid dissociation constant $pKa_1$ at the first stage is 4.56, like the citric acid, is weak organic acid, but does not have two or more ligands, it does not produce the chelating compound and thus has no effect of preventing readhesion of the residue.

Organic Acid Salt: 0.1 to 3.0 Mass %

The organic acid salt is the buffer component which keeps the concentration of $HF_2^-$ in the cleaning solution constant when the concentration of each component in the cleaning solution changes due to dilution, enriching and the like. When the content of the organic acid salt is less than 0.1 mass %, the concentration of $HF_2^-$ in the cleaning solution increases, causing dissolution or degrading of the nickel silicide layer and the interlayer insulating film. When the content of the organic acid salt exceeds 3.0 mass %, the residue removability drops. It is therefore preferable that the content of the organic acid salt should be 0.1 to 3.0 mass %, more preferably, 0.3 to 1.5 mass %. It is preferable to use a carboxylic ammonium salt whose the acid dissociation constant $pKa_n$ at 25° C. is 2.5 or greater as the organic acid salt to be added to the cleaning solution of the embodiment. Such organic acid salts available include ammonium malonate, ammonium lactate, ammonium glycolate, ammonium citrate, and ammonium tartrate. Of organic acid salts, ammonium tartrate and ammonium citrate are particularly preferable. The use of such organic acid salts can remove residues without damaging the nickel silicide layer even when the cleaning solution is enriched or diluted. This widens the margin for usage, thus allowing the cleaning solution to be recycled.

It is preferable that pH of the cleaning solution of the embodiment should be 7.0 or less. When pH of the solution exceeds 7.0, the residue removability may drop. When the acidity of the cleaning solution increases, the nickel silicide layer is likely to be damaged. In this respect, it is preferable that pH of the cleaning solution should be 5 or greater, more preferably, 5.0 to 6.0. This can improve residue removability and can significantly suppress damages on the nickel silicide layer.

The cleaning solution of the embodiment can demonstrate similar effects in cleaning a substrate on which the silicide layer having a metal, such as Ta, Zr, Co or V, added to $NiSi_x$, and a substrate having an impurity doped in the nickel silicide layer, as well as a substrate on which the nickel silicide layer of $NiSi_x$ is formed. The cleaning solution of the embodiment can also applied to a substrate whose nickel silicide layer has a thickness of 10 nm or less. Although the foregoing description has been given of the cleaning solution comprised of the solution essentially consisting of the fluorine-containing compound, the chelating agent and the organic acid salt, the invention is not limited to this type, but the cleaning solution may contain, for example, an additive component, such as surfactant or aqueous organic solvent, in addition to the fluorine-containing compound, the chelating agent and the organic acid salt.

A method of manufacturing a semiconductor device, as the second embodiment of the invention, by using the cleaning solution of the first embodiment will be described. FIGS. 1A to 1D are cross-sectional views showing the manufacturing method for a semiconductor device according to the second embodiment step by step. First, as shown in FIG. 1A, a nickel silicide layer 2 is formed on a silicon substrate 1. The thickness of the nickel silicide layer 2 is 10 nm or so, for example. The top surfaces of the nickel silicide layer 2 and the underlying silicon substrate 1 are respectively doped with As and P of $1 \times 10^{15}$ to $5 \times 10^{15}$ cm$^{-2}$ or so, as diffusion layers, with an acceleration voltage of 5 to 10 eV.

Figure 1B:
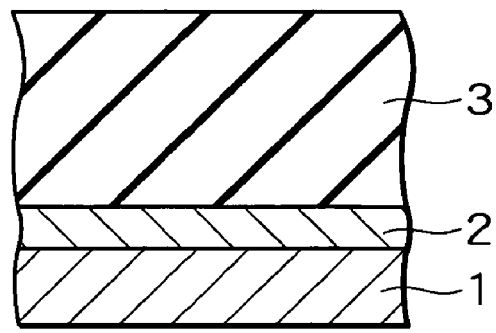
Figure 1C:
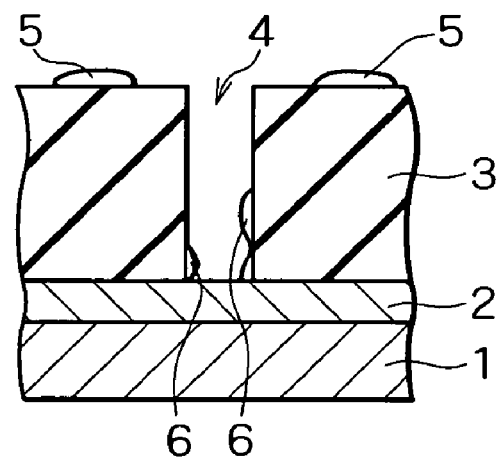

Next, as shown in FIG. 1B, an interlayer insulating film 3 is formed on the nickel silicide layer 2. The interlayer insulating film 3 can be formed by laminating a plasma silicon nitride (P-SiN) film, a silicon oxide ($SiO_2$) film and a plasma silicon oxide (P-$SiO_2$) film in the named order. The P-SiN film, the $SiO_2$ film and the P-$SiO_2$ film have thicknesses of 30 nm or so, 100 nm or so and 450 nm or so, respectively. As shown in FIG. 1C, a resist pattern is formed on the interlayer insulating film 3, dry etching is performed with the resist pattern as a mask, then an ashing process is performed with the plasma or the like to remove the resist pattern, thereby forming a through hole 4 in the interlayer insulating film 3. At this time, the ashing residue 5 comprising the incompletely ashed product and the oxide of the resist adheres to the top surface of the interlayer insulating film 3, the etching deposition 6 containing C, F, Si, O, Ni, N or the like adheres to the interior of the through hole 4.

Figure 1D:
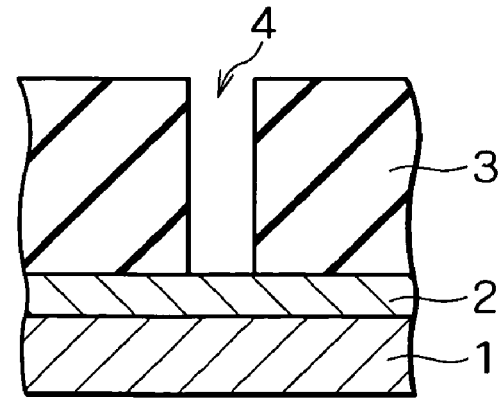

Next, a wafer after the ashing process shown in FIG. 1C is cleaned with the cleaning solution consisting of the fluorine-containing compound by 1.0 to 5.0 mass %, the chelating agent by 0.2 to 5.0 mass % and the organic acid salt by 0.1 to 3.0 mass % with the remainder being water and an inevitable impurity. As a result, residues, such as the ashing residue 5 and the etching deposition 6 adhered to the top surface of the interlayer insulating film 3 and the interior of the through hole 4, are removed as shown in FIG. 1D.

Figure 2:
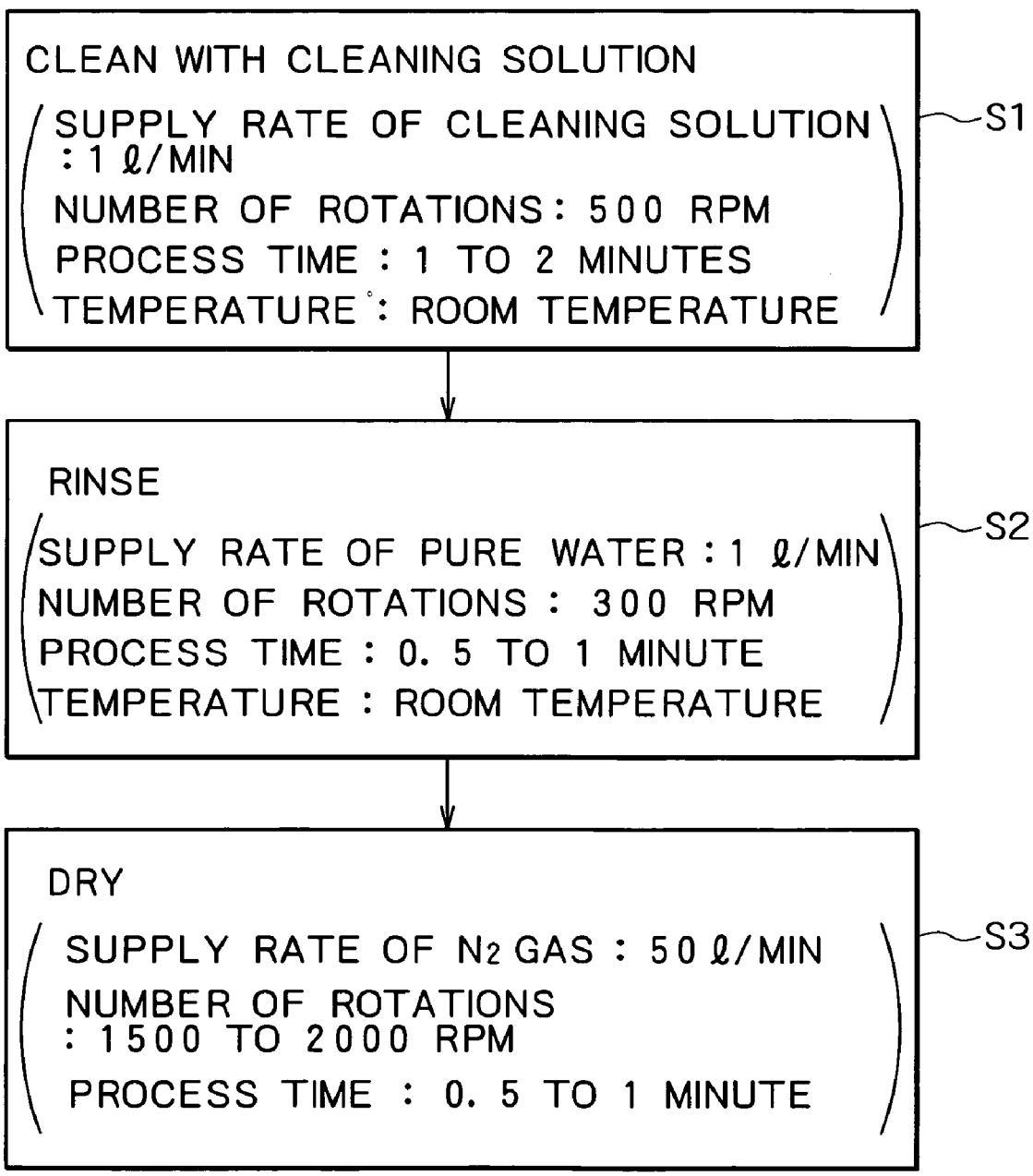
FIG. 2 is a flowchart illustrating a wafer cleaning method.
Figure 3:
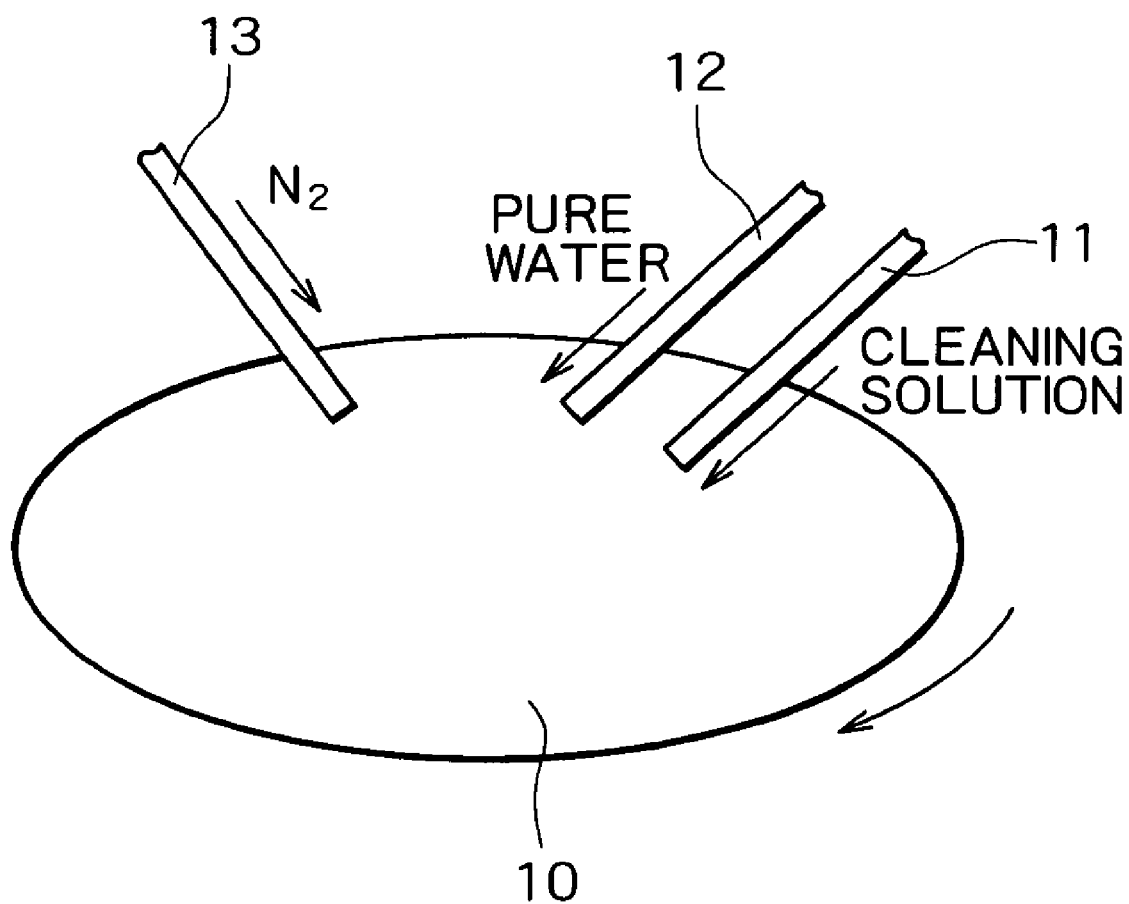
FIG. 3 is a perspective view exemplarily showing the wafer cleaning method.

The following is a detailed description of the residue removing method, i.e., the method of cleaning a wafer after an ashing process. FIG. 2 is a flowchart illustrating the wafer cleaning method, and FIG. 3 is a perspective view exemplarily showing the wafer cleaning method. As shown in FIGS. 2 and 3, single wafer cleaning is executed using a spin type cleaning apparatus provided with a cleaning solution nozzle 11, a pure water nozzle 12 and a nitrogen gas nozzle 13 in the manufacturing method for a semiconductor device according to the embodiment. First, a wafer 10 after an ashing process is placed in the cleaning apparatus, and the wafer 10 is cleaned with the cleaning solution dropped onto the top surface from the cleaning solution nozzle 11 at a rate of about 1 liter/min for one to two minutes while being rotated at, for example, 500 rpm (step S1). The cleaning solution used at step S1 is collected, is filtered to remove dust or the like, and is recycled.

Next, with the number of rotations being changed to 300 rpm, the top surface of the wafer 10 is rinsed with pure water dropped onto the top surface from the pure water nozzle 12 at a rate of about 1 liter/min for 0.5 to one minute (step S2). Thereafter, with the number of rotations being changed to 1500 to 2000 rpm, the top surface of the wafer 10 is dried with nitrogen gas jetted onto the top surface from the nitrogen gas nozzle 13 at a rate of about 50 liters/min for 0.5 to one minute (step S3).

As the manufacturing method for a semiconductor device according to the embodiment uses a solution containing the fluorine-containing compound, the chelating agent and the organic acid salt as the cleaning solution, the residue remaining after ashing can be removed without damaging the nickel silicide layer. Having a wide margin for usage, the cleaning solution can be recycled. Because the manufacturing method for a semiconductor device according to the embodiment performs spin type single wafer cleaning, residues will not be readhered as done in immersion cleaning, and thus has excellent residue removability.

Although the manufacturing method for a semiconductor device according to the second embodiment is executed at room temperature, the invention is not restrictive to the case, but cleaning can be carried out in a temperature range of room temperature to 40° C. Although the thickness of the nickel silicide layer 2 is mentioned to be 10 nm or so in the foregoing description of the manufacturing method for a semiconductor device according to the second embodiment, similar effects can be acquired if the thickness of the nickel silicide layer 2 is within a range of 5 to 50 nm or so.

The following will specifically describe the effects of examples of the invention as compared with comparative examples which are out of the scope of the invention. First, as the first example of the invention, cleaning solutions of Examples 1 to 10 were prepared by using a mixture of ammonium fluoride ($NH_4F$) or methylethanolamine (MEA) and hydrogen fluoride (HF) as the fluorine-containing compound, using triammonium citrate as the organic acid salt, and by changing the type of the chelating agent. Cleaning solution having phosphoric acid added in place of the chelating agent was prepared as Comparative Example 1 of the first example, cleaning solution having acetic acid added was prepared as Comparative Example 2, and cleaning solution having methanesulfonic acid added was prepared as Comparative Example 3. The compositions of Examples 1 to 10 and Comparative Examples 1 to 3 are given in Table 2 below.

TABLE 2

| | fluorine-containing compound | | chelating agent | | organic acid salt | | others | | |
|---|---|---|---|---|---|---|---|---|---|
| | type | content | type | content | type | content | type | content | remainder |
| Ex. 1 | NH₄F | 2.0 | citric acid | 0.5 | triammonium citrate | 1.0 | — | — | water and inevitable impurity |
| Ex. 2 | NH₄F | 2.0 | tartaric acid | 0.5 | triammonium citrate | 1.0 | — | — | |
| Ex. 3 | NH₄F | 2.0 | malonic acid | 0.5 | triammonium citrate | 1.0 | — | — | |
| Ex. 4 | NH₄F | 2.0 | glycolic acid | 0.5 | triammonium citrate | 1.0 | — | — | |
| Ex. 5 | NH₄F | 2.0 | lactic acid | 0.5 | triammonium citrate | 1.0 | — | — | |
| Ex. 6 | NH₄F | 2.0 | catechol | 1.0 | triammonium citrate | 1.0 | — | — | |
| Ex. 7 | NH₄F | 2.0 | pyrogallol | 1.0 | triammonium citrate | 1.0 | — | — | |
| Ex. 8 | NH₄F | 2.0 | acetylacetone | 1.0 | triammonium citrate | 1.0 | — | — | |
| Ex. 9 | MEA + HF | 2.0 | acetylacetone | 1.0 | triammonium citrate | 1.0 | — | — | |
| Ex. 10 | NH₄F | 2.0 | acetylacetone | 1.0 | triammonium citrate | 1.0 | — | — | |
| Com. Ex. 1 | NH₄F | 2.0 | — | — | triammonium citrate | 1.0 | phosphoric acid | 0.1 | |
| Com. Ex. 2 | NH₄F | 2.0 | — | — | triammonium citrate | 1.0 | acidic acid | 0.1 | |
| Com. Ex. 3 | NH₄F | 2.0 | — | — | triammonium citrate | 1.0 | methansulfonic acid | 0.1 | |

The influences of the cleaning solutions of Examples 1 to 10 and Comparative Examples 1 to 3 on the residue removability, the nickel silicide layer and the interlayer insulating film were evaluated. First, a wafer having undergone up to the ashing process by the method illustrated in FIGS. 1A to 1C was dipped in each cleaning solution for five minutes without being stirred. The then temperature of each cleaning solution was held at 35° C. Next, the wafer was rinsed with flowing DIW (Deionized Water) for one minute, and was dried with nitrogen gas blow, after which evaluation on the individual items was made. Observing the wafer surface with a ×100,000 or so magnification, the residue removability was evaluated and was marked "O" when no ashing residue and etching deposition were observed, and was marked "X" when they were observed. Observing the cross sections of the nickel silicide layer and the interlayer insulating film with a ×300,000 or so magnification, damages on the nickel silicide layer and the interlayer insulating film were evaluated, and was marked "O" when there were no surface roughening observed, was marked "Δ" when there were slight surface roughening observed, and was marked "X" when the films became thinner to show the bases. Those examples marked "O" and "Δ" were considered adaptable. The results are shown in Table 3 below.

TABLE 3

| | Evaluation results | | | |
|---|---|---|---|---|
| | | damages | | |
| | residue removability | nickel silicide layer | interlayer insulating film | decision |
| Ex. 1 | O | O | O | O |
| Ex. 2 | O | O | O | O |
| Ex. 3 | O | O | O | O |
| Ex. 4 | O | O | O | O |
| Ex. 5 | O | O | O | O |
| Ex. 6 | O | O | O | O |
| Ex. 7 | O | O | O | O |
| Ex. 8 | O | O | O | O |
| Ex. 9 | O | O | O | O |
| Ex. 10 | O | O | O | O |
| Com. Ex. 1 | O | X | X | X |
| Com. Ex. 2 | O | X | Δ | X |
| Com. Ex. 3 | O | X | X | X |

As shown in Table 3, the cleaning solutions of Comparative Examples 1 to 3 containing no chelating agent damaged the nickel silicide layer while showing good residue removability. The cleaning solution of Comparative Example 1 using phosphoric acid or inorganic acid and the cleaning solution of Comparative Example 3 using methansulfonic acid or the organic acid damaged the interlayer insulating film too. The cleaning solutions of Examples 1 to 10, on the other hand, could remove residues after ashing without damaging the nickel silicide layer and the interlayer insulating film. Particularly, with the use of the cleaning solutions of Examples 1 to 10 using acetylacetone, catechol and pyrogallol having acid dissociation constant $pKa_n$ of 8.0 or greater, the surface of the nickel silicide layer was extremely smooth.

Next, as the second example of the invention, the cleaning solutions of Examples 11 to 21 were prepared by using an ammonium fluoride (NH$_4$F) as the fluorine-containing compound, acetylacetone as the chelating agent, and triammonium citrate as the organic acid salt, and by changing the content of each component. The influences of those cleaning solutions on the residue removability, the nickel silicide layer and the interlayer insulating film were evaluated by a method similar to that of the first example. The results are shown in the following Table 4.

the residue removability and damages on the nickel silicide layer and the interlayer insulating film were evaluated by a method similar to those of the first and second examples using the cleaning solution of Example 13 shown in Table 4, with the times for dipping the wafer in the cleaning solution being two minutes, five minutes and ten minutes, and at the temperatures of the cleaning solution of 25° C., 35° C. and 45° C. The results are shown in the following Table 5.

TABLE 4

| | Composition (mass %) | | | | | | Evaluation results | | | |
|---|---|---|---|---|---|---|---|---|---|---|
| | fluorine-containing compound | | chelating agent | | organic acid salt | | | | damages | |
| | | | | | | | | residue | nickel silicide | interlayer insulating |
| | type | content | type | content | type | content | remainder | removability | layer | film | decision |
| Ex. 11 | NH$_4$F | 2.5 | acetylacetone | 1.0 | triammonium citrate | 1.0 | water and inivitable impurity | ○ | ○ | ○ | ○ |
| Ex. 12 | NH$_4$F | 2.0 | acetylacetone | 1.5 | triammonium citrate | 1.0 | | ○ | ○ | ○ | ○ |
| Ex. 13 | NH$_4$F | 2.0 | acetylacetone | 1.8 | triammonium citrate | 1.0 | | ○ | ○ | ○ | ○ |
| Ex. 14 | NH$_4$F | 2.0 | acetylacetone | 1.0 | triammonium citrate | 0.3 | | ○ | ○ | ○ | ○ |
| Ex. 15 | NH$_4$F | 2.0 | acetylacetone | 1.0 | triammonium citrate | 1.3 | | ○ | ○ | ○ | ○ |
| Ex. 16 | NH$_4$F | 1.5 | acetylacetone | 1.0 | triammonium citrate | 1.0 | | Δ | ○ | ○ | Δ |
| Ex. 17 | NH$_4$F | 3.0 | acetylacetone | 1.0 | triammonium citrate | 1.0 | | ○ | ○ | Δ | Δ |
| Ex. 18 | NH$_4$F | 2.0 | acetylacetone | 0.4 | triammonium citrate | 1.0 | | Δ | ○ | ○ | Δ |
| Ex. 19 | NH$_4$F | 2.0 | acetylacetone | 2.5 | triammonium citrate | 1.0 | | ○ | Δ | Δ | Δ |
| Ex. 20 | NH$_4$F | 2.0 | acetylacetone | 1.0 | triammonium citrate | 0.2 | | ○ | Δ | ○ | Δ |
| Ex. 21 | NH$_4$F | 2.0 | acetylacetone | 1.0 | triammonium citrate | 2.0 | | Δ | ○ | ○ | Δ |

As apparent from Table 4, all of the cleaning solutions of Examples 11 to 21 were adaptable. It is to be noted however that the cleaning solution of Example 16 suffered slight degradation on the residue removability for the content of the fluorine-containing compound was less than 2.0 mass %. While the cleaning solution of Example 17 was adaptable, the surface of the interlayer insulating film had slight roughening. The cleaning solution of Example 18 showed slightly degraded residue removability for the content of the chelating agent was less than 0.5 mass %. While the cleaning solution of Example 19 showed roughening on the nickel silicide layer and the interlayer insulating film slight enough to be adaptable. With the content of the organic acid salt being less than 0.3 mass %, the cleaning solution of Example 20 was within the adaptable range, but slightly damaged the nickel silicide layer. With the content of the organic acid salt being greater than 1.5 mass %, the cleaning solution of Example 21 suffered slightly poor residue removability. The cleaning solutions of Examples 11 to 15 could remove residues after ashing while hardly damaging the nickel silicide layer and the interlayer insulating film.

Next, as the third example of the invention, the cleaning solution of the margin for usage was evaluated. Specifically,

TABLE 5

| Cleaning conditions | | Evaluation results | | | |
|---|---|---|---|---|---|
| temperature of cleaning solution (° C.) | dipping time (min) | residue removability | nickel silicide layer | interlayer insulating film | decision |
| | | | damages | | |
| 25 | 2 | ○ | ○ | ○ | ○ |
| 25 | 5 | ○ | ○ | ○ | ○ |
| 25 | 10 | ○ | X | X | X |
| 35 | 2 | ○ | ○ | ○ | ○ |
| 35 | 5 | ○ | ○ | ○ | ○ |
| 35 | 10 | ○ | X | X | X |
| 45 | 2 | ○ | X | X | X |
| 45 | 5 | ○ | X | X | X |
| 45 | 10 | ○ | X | X | X |

As apparent from Table 5, the cleaning solution of Example 13 of the invention could remove residues after ashing without damaging the nickel silicide layer and the interlayer insulating film, with the times for dipping the wafer in the cleaning solution being two to five minutes, and at the temperature range of the cleaning solution of 25 to 35° C. The evaluation results given in Table 5 showed the results with the wafer being dipped in the cleaning solution. When cleaning was done by the spin type, on the other hand, the lateral flow of the cleaning solution occurred so that cleaning could be done in a shorter time than that in the case where immersion cleaning was performed as per the example, thereby yielding similar cleaning effects with a cleaning time of about one to three minutes. There hardly was any difference in influence on damages on the nickel silicide layer and the interlayer insulating film between the immersion method and the spin method, and adequate cleaning was carried out in one to five minutes even when cleaning was done with the spin method.

What is claimed is:

1. An aqueous cleaning solution consisting of:
   1.0 to 5.0 mass % of a fluorine-containing compound;
   0.2 to 5.0 mass % of a chelating agent;
   0.1 to 3.0 mass % of an organic acid salt; and
   water, and
   wherein said cleaning solution is capable of cleaning a substrate on which a nickel silicide layer is formed,
   wherein said fluorine-containing compound is at least one compound selected from the group consisting of hydrofluoric acid, ammonium fluoride, and amine fluoride,
   wherein said chelating agent is selected from a group consisting of chelating agents having an acid dissociation constant $pKa_n$ of 8.0 or greater at 25° C. when a dissociation stage for a basic acid having a valence of n, wherein n being an integer of 1 or greater, is n-th stage, and
   wherein said organic acid salt is selected from carboxylic ammonium salt having an acid dissociation constant $pKa_n$ of 2.5 or greater at 25° C. when a dissociation stage for a basic acid having a valence of n, wherein n being an integer of 1 or greater, is n-th stage.

2. The cleaning solution according to claim 1, wherein the chelating agent is selected from the group consisting of acetylacetone, catechol, and pyrogallol, and the organic acid salt is selected from the group consisting of ammonium malonate, ammonium lactate, ammonium glycolate, ammonium citrate, and ammonium tartarate.

3. The cleaning solution according to claim 1, wherein the content of the fluorine-containing compound is 2.0 to 3.0 mass %, the content of the chelating agent is 0.5 to 2.5 mass %, and the content of the organic acid salt is 0.3 to 1.5 mass %.

4. The cleaning solution according to claim 1, having a pH of 7.0 or less.

5. The cleaning solution according to claim 1, wherein a thickness of the nickel silicide layer is 50 nm or less.

6. The cleaning solution according to claim 1, wherein at least one kind of metal selected from the group consisting of Ta, Zr, Co, and V is contained in the nickel silicide layer.

7. The cleaning solution according to claim 1, wherein the nickel silicide layer is doped with an impurity.

* * * * *